(12) United States Patent
Yeo et al.

(10) Patent No.: US 6,492,216 B1
(45) Date of Patent: Dec. 10, 2002

(54) METHOD OF FORMING A TRANSISTOR WITH A STRAINED CHANNEL

(75) Inventors: Yee-Chia Yeo, Albany, CA (US); Fu-Liang Yang, Hsin-Chu (TW); Chenming Hu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/068,926

(22) Filed: Feb. 7, 2002

(51) Int. Cl.⁷ .............................................. H01L 21/336
(52) U.S. Cl. ....................................... 438/197; 438/285
(58) Field of Search ...................... 438/197, 93, 105, 438/285, 217, 172, 299

(56) References Cited

U.S. PATENT DOCUMENTS

| | | | |
|---|---|---|---|
| 4,885,614 A | * 12/1989 | Furukawa et al. | 257/183 |
| 5,659,187 A | 8/1997 | Legoues et al. | 257/190 |
| 5,891,769 A | 4/1999 | Liaw et al. | 438/167 |
| 5,906,951 A | 5/1999 | Chu et al. | 438/751 |
| 6,165,837 A | 12/2000 | Kawakubo et al. | 438/244 |
| 6,190,975 B1 | * 2/2001 | Kubo et al. | 438/199 |
| 6,291,321 B1 | 9/2001 | Fitzgerald | 438/494 |
| 6,313,016 B1 | 11/2001 | Kibbel et al. | 438/478 |
| 2002/0011617 A1 | * 1/2002 | Kubo et al. | 257/301 |

* cited by examiner

*Primary Examiner*—Tuan H. Nguyen
(74) *Attorney, Agent, or Firm*—George O. Saile; Stephen B. Ackerman

(57) ABSTRACT

A method of forming a tensile or compressive strained channel region for a semiconductor device, such as a MOSFET device, allowing improved carrier transport properties and increased device performance to be realized, has been developed. The method features the epitaxial growth of a semiconductor layer such as silicon, or silicon-germanium, with the incorporation of atoms such as carbon. The silicon-germanium-carbon channel layer, under biaxial tensile or compressive strain, is then overlaid with an optional silicon capping layer, used to accommodate the overlying, thermally grown silicon dioxide gate insulator layer, of the MOSFET device.

32 Claims, 4 Drawing Sheets

METHOD OF FORMING A TRANSISTOR WITH A STRAINED CHANNEL

BACKGROUND OF THE INVENTION

(1) Field of the Invention

The present invention relates to methods used to fabricate semiconductor devices, and more specifically to a method used to fabricate a semiconductor device comprised with a tensile or compressive strained channel region used for performance enhancement.

(2) Description of Prior Art

An attractive approach for improving the performance of a metal oxide semiconductor field effect transistor (MOSFET), or of a complimentary metal oxide semiconductor (CMOS), device is the introduction of strain induced band modification for mobility enhancement to increase drive current. A compressive strained channel, such as a silicon-germanium channel layer grown on silicon, has significant hole mobility enhancement. A tensile strained channel, such as a thin silicon channel layer grown on relaxed silicon-germanium, achieves significant electron and hole mobility enhancement. The most common method of introducing tensile strain in a silicon channel region is to epitaxially grow the silicon channel layer on a relaxed silicon-germanium (SiGe), layer or substrate. The ability to form a relaxed SiGe layer is paramount in obtaining an overlying, epitaxially grown, silicon layer under biaxial tensile strain, however the attainment of the relaxed SiGe layer can be costly and difficult to achieve.

This invention will describe a process for forming a tensile strained silicon or silicon-germanium channel without the use of an underlying, relaxed SiGe layer. The underlying concept is the introduction of an element with a smaller atomic size than that of silicon, into the silicon or silicon-germanium layer to be used for the channel region. An example of such an element is carbon. The channel layer may therefore be comprised of silicon, germanium, and carbon, and have a lattice constant smaller than that of the underlying silicon substrate. As a result the channel layer will be under biaxial tensile strain. The attainment of the silicon channel layer under biaxial strain, incorporated into a CMOS device, will compute to improved carrier transport properties and thus enhanced MOSFET or CMOS performance. Prior art such as: Kibbel et al, in U.S. Pat. No 6,313,016; Liaw et al, in U.S. Pat. No. 5,891,769; Kawakubo et al, in U.S. Pat. No. 6,165,837; Chu et al, in U.S. Pat. No. 5,906,951; Fitzgerald et al, in U.S. Pat. No. 6,291,321; and Leoues et al, in U.S. Pat. No. 5,659,187, all describe processes for forming strained layers formed on underlying SiGe layers. However none of the above prior arts describe the novel process described in this present invention in which a tensile strained silicon, or silicon-germanium layer is obtained via incorporation of an atom into the channel layer, so that the channel layer has a lattice constant smaller than the lattice constant of the substrate material, therefore avoiding the use of a relaxed SiGe layer, as an underlying layer during epitaxial growth of the tensile strained channel layer. In this invention the incorporation of an atom smaller than silicon, such as carbon, into the channel layer can be performed during the epitaxial growth of the channel layer, or during subsequent processing steps such as by ion implantation. An example is the growth of a SiGe channel layer and the implantation of carbon into the SiGe layer.

SUMMARY OF THE INVENTION

It is an object of the invention to form a channel region for a MOSFET device, via use of a semiconductor alloy layer characterized as being under biaxial tensile or compressive strain, depending on the amount of incorporation of an element with a smaller atomic size than that of silicon.

It is another object of this invention to epitaxially grow the semiconductor alloy layer featuring biaxial tensile strain on a single crystalline silicon substrate, with the semiconductor alloy layer comprised of silicon or silicon-germanium, and an element with an atomic size smaller than that of silicon, such as carbon, resulting in a $Si_{(1-y)}C_{(y)}$ or $Si_{(1-x-y)}Ge_xC_y$ alloy layer.

It is yet another object of this invention to form a silicon capping layer on the underlying semiconductor alloy layer to provide the needed silicon for a silicon dioxide gate insulator layer, obtained via thermal oxidation procedures.

In accordance with the present invention a method used to fabricate a MOSFET device featuring a semiconductor alloy channel region under biaxial tensile or compressive strain, epitaxially grown on an underlying single crystalline silicon substrate, is described. A semiconductor alloy layer is epitaxially grown on an underlying silicon substrate, with the semiconductor alloy layer comprised with an element with an atomic size different from that of silicon. One such semiconductor alloy, silicon-germanium-carbon, is epitaxially grown on the underlying semiconductor substrate, exhibiting the biaxial tensile or compressive strain desired for the channel region. If the carbon concentration y, is low compared to that of Ge, ie, y<0.1x, the $Si_{(1-x-y)}Ge_xC_y$ layer exhibits compressive strain. If the carbon concentration y, is high compared to that of Ge, ie, y>0.1x, the $Si_{(1-x-y)}Ge_xC_y$ layer exhibits tensile strain. A silicon capping layer is next epitaxially grown on the silicon-germanium-carbon layer, followed by a thermal oxidation procedure resulting in growth of a gate insulator layer, with the oxidation procedure consuming a top portion of the silicon capping layer. Definition of a gate structure is followed by formation of a source/drain extension region in an area of semiconductor materials not covered by the gate structure. After formation of insulator spacers on the sides of the gate structure, a heavily doped source/drain region is formed in an area of the semiconductor materials not covered by the gate structure or by the insulator spacers. A rapid thermal anneal procedure is used to activate the dopants in the source/drain region using conditions designed not to disturb the strain in the channel region. Metal silicide regions are formed on the source/drain and gate structures with an option of removing the silicon-germanium-carbon alloy prior to the silicidization procedure, then forming the metal silicide layer on the heavily doped source/drain region located in the silicon substrate, thus avoiding silicidization involvement with germanium and carbon atoms, while a second option entailing formation of metal silicide on raised source/drain structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method used to fabricate a MOSFET device featuring a semiconductor alloy channel region such as a silicongermanium-carbon channel region, comprised under biaxial tensile or compressive strain, wherein the silicon-germanium-carbon tensile strained layer is formed on an underlying single crystalline silicon substrate, will now be described in detail. Semiconductor substrate 1, comprised of P type, single crystalline silicon, is used and schematically shown in FIG. 1. The critical layer needed to provide a channel region under the desired strain, which will provide the enhancement of transport carriers, is next addressed. To obtain a layer under biaxial tensile strain without having to grow the layer on an underlying, relaxed silicon-germanium layer, requires the incorporation of atoms into the subsequent channel layer, wherein the lattice constant of the incorporated atom is smaller than the lattice constant of silicon. The channel layer, epitaxially grown with at a specific thickness, and with the incorporation of a specific amount of smaller lattice atoms, would allow the desired tensile strained, semiconductor alloy to be present on an underlying single crystalline silicon substrate thus negating the need of an underlying, relaxed layer of silicon-germanium. One such atom satisfying these conditions is the carbon atom, allowing a silicon-germanium-carbon layer to be epitaxially grown on the underlying single crystalline silicon substrate, exhibiting the desired biaxial tensile strain. Note that a compressive strained channel, such as a thin silicon-germanium channel layer grown on a silicon substrate, has significant hole mobility enhancement. The introduction of a substantial amount of carbon in this silicon-germanium channel layer results in the achievement of tensile strain. Tensile strain leads to both electron and hole mobility enhancement.

Figure 1:
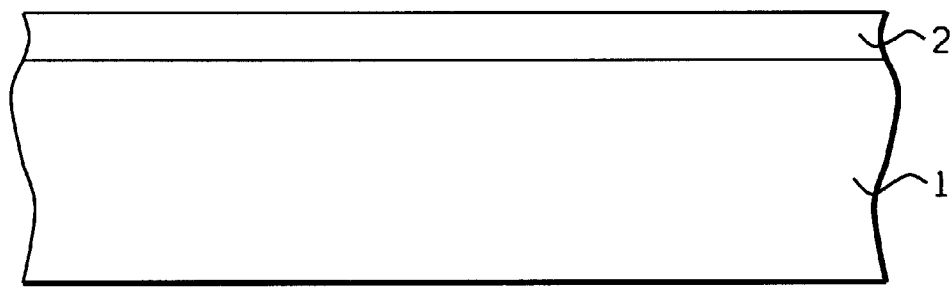
FIGS. 1–9, which schematically, in cross-sectional style, describe key stages employed to to fabricate a MOSFET device featuring a semiconductor alloy channel region such as a silicon-germanium-carbon channel region, under biaxial tensile or compressive strain, epitaxially grown on an underlying single crystalline silicon substrate.

Silicon-germanium-carbon layer 2, schematically shown in FIG. 1, is epitaxially grown, using ultra high vacuum chemical vapor deposition (UHVCVD), procedures, at a temperature between about 500 to 800° C., using silane or disilane as a source for silicon, while using a carbon precursor such as methylsilane. The thickness of silicon-germanium carbon layer 2, should be less than the critical thickness above which spontaneous strain relaxation occurs, therefore between about 20 to 500 Angstroms. The carbon content is between about 0 to 4%, or a carbon mole fraction between about 0 to 0.04. To insure that the tensile strain is incorporated in the $Si_{(1-x-y)}Ge_xC_y$ layer, the carbon mole fraction y, has to be sufficiently high compared to the germanium mole fraction, ie, y>0.1x. The example of silicon-germanium carbon layer 2, shown in FIG. 1, is for the option of first growing the desired channel layers, followed by formation of shallow trench isolation (STI) regions in the channel layers and in the underlying semiconductor substrate. However if desired the STI regions can be initially formed then followed by selective epitaxy procedures, resulting in the growth of the silicon-germanium carbon layer on substantially the portions of the semiconductor substrate not occupied with STI regions. In addition the carbon atoms need not be introduced during the epitaxial growth of the channel layer. The silicon-germanium-carbon layer may be formed by the epitaxial growth of silicon-germanium, and subsequent ion implantation of carbon into the SiGe layer. The carbon atoms may also be implanted on selected active or channel regions so that the un-implanted channel regions are under compressive strain while implanted channel regions are under tensile strain. The un-implanted compressive strained channel region may be used for P channel transistors, while the tensile strained channel regions may be used for N channel transistors.

Figure 2:
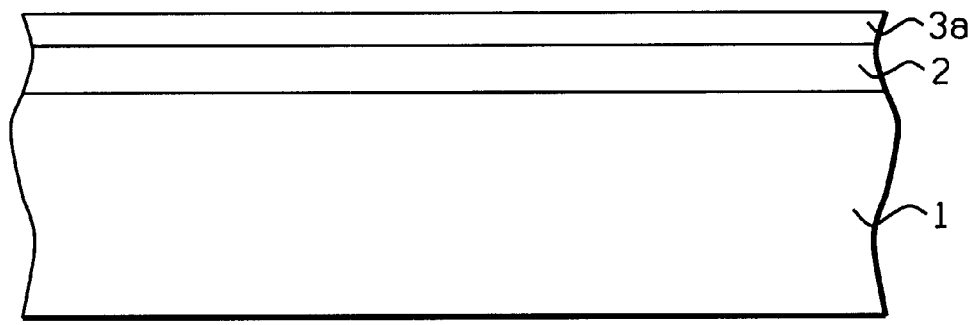

An optional silicon capping layer, if desired, can next be grown for purposes of supplying the semiconductor material needed for a subsequent thermally grown silicon dioxide gate insulator layer. This option will prevent loss if carbon atoms during the thermal oxidation procedure. Therefore silicon capping layer 3a, is epitaxially grown on silicon-germanium-carbon layer 2, at a temperature between about 500 to 800° C., using silane, or disilane as a source. The as—grown thickness for silicon capping layer 3a, is determined by the thickness of the subsequent silicon dioxide gate insulator layer. Therefore silicon capping layer 3a, shown schematically in FIG. 2, is grown to a thickness between about 0 to 150 Angstroms, so that the final thickness of silicon capping layer 3b, after growth of an overlying silicon dioxide gate insulator layer will be between about 0 to 100 Angstroms.

Figure 3:
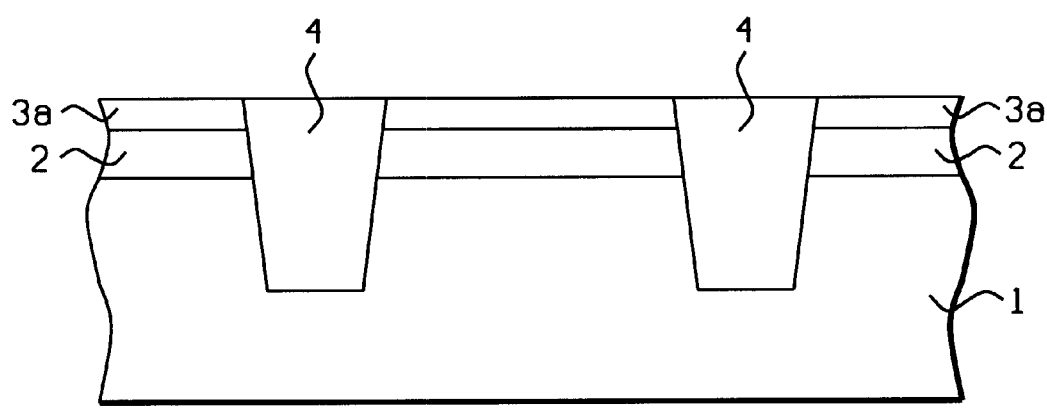

Shallow trench isolation (STI) regions 4, can now be formed in silicon capping layer 3a, in silicon-germanium carbon layer 2, and in a top portion of semiconductor substrate 1. This is accomplished via definition of shallow trench shapes in the above mentioned layers, using conventional photo masking and dry etching procedures, wherein $Cl_2$ or $SF_6$ is used as an etchant for silicon, or silicon-germanium-carbon. After removal of the photoresist shape used to define the shallow trench shapes, a silicon oxide layer is deposited via low pressure chemical vapor deposition (PCVD), or plasma enhanced chemical vapor deposition (PECVD), procedures, completely filling the shallow trench shapes. Tetraethylorthosilicate (TEOS), is used as the source for silicon oxide. Removal of silicon oxide from the top surface of silicon capping layer 3a, is accomplished via a selective chemical mechanical polishing (CMP) procedure, or via a selective dry etch procedure using $CHF_3$ as an etchant for silicon oxide, resulting in STI regions 4, schematically shown in FIG. 3. If desired STI regions 4, can be defined in top portions of semiconductor substrate 1, prior to epitaxial growth of silicon-germanium-carbon layer 2, and of silicon capping layer 3a. The definition of STI regions 4, would then be followed by selective epitaxial growth of silicon-germanium-carbon layer 2, and silicon capping layer 3a, only on the top surface portions of semiconductor substrate 1, not occupied by STI regions 4.

Figure 4:
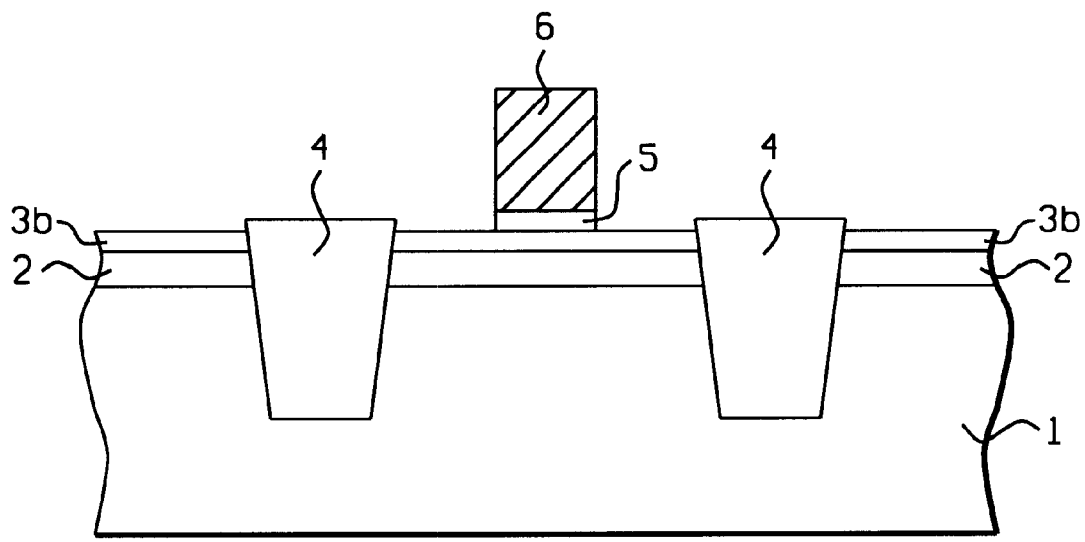

Silicon dioxide gate insulator layer 5, is next thermally grown at a temperature between about 600 to 1000° C., in an oxygen-steam ambient, to a thickness between about 5 to 100 Angstroms. The degree of oxidation, as well as the initial thickness of silicon capping layer 3a, results in a final thickness of between about 0 to 100 Angstroms for final silicon capping layer 3b, after the oxidation procedure. In addition the thin, final silicon capping layer ensures that the peak of the inversion charge density will be in a channel region comprised of silicon-germanium-carbon layer 2. An intrinsic polysilicon layer is next deposited at a thickness between about 500 to 2000 Angstroms, via LPCVD procedure, using silane, or disilane as a source. A photoresist shape, not shown in the drawings, is used as a mask to allow a reactive ion etching (RIE), procedure to define polysilicon gate structure 6, on silicon dioxide gate insulator layer 5. This is schematically shown in FIG. 4. Removal of the photoresist shape is accomplished via plasma oxygen ashing and wet clean procedures, with a final buffered hydrofluoric (BHF) cycle of the wet clean procedure removing the portions of silicon dioxide gate insulator layer 5, not covered by polysilicon gate structure 6.

Figure 5:
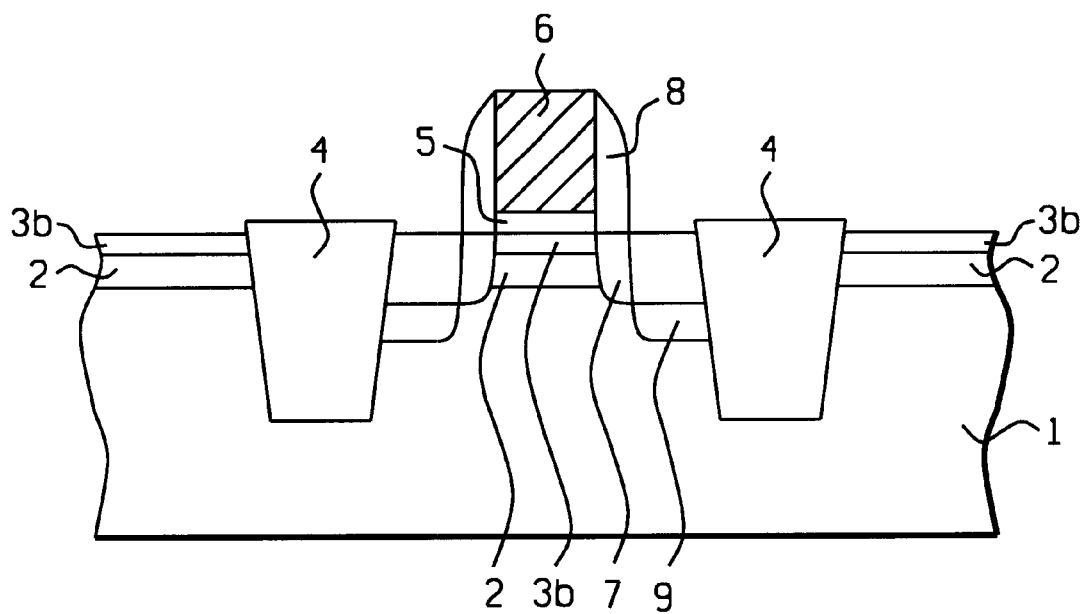
Figure 6:
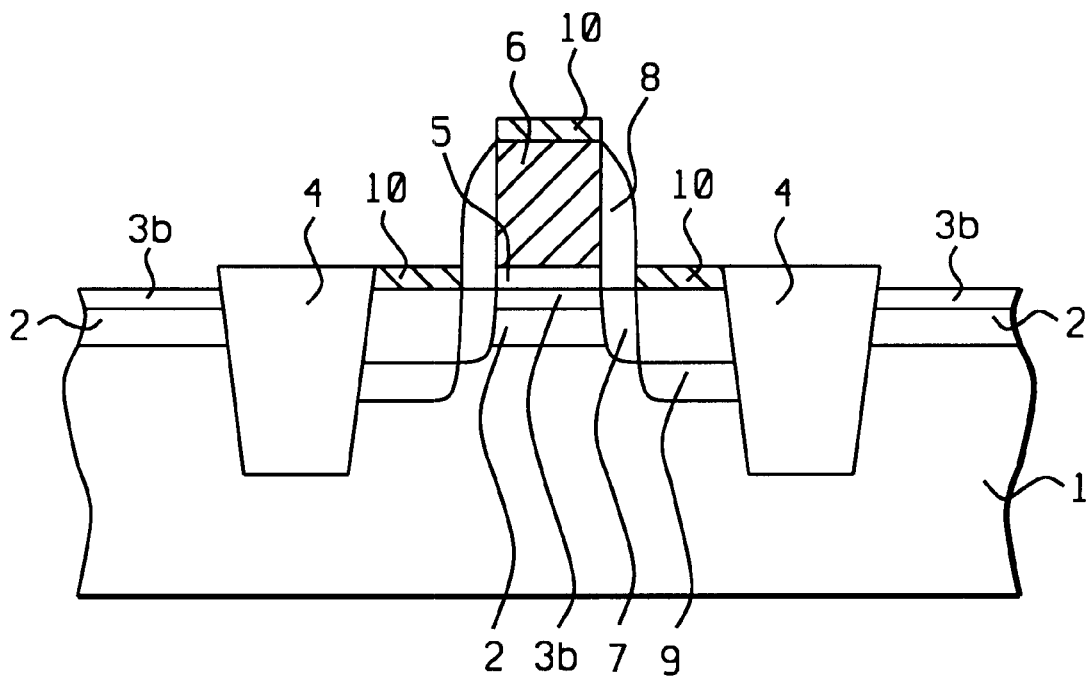

The completion of a MOSFET device, featuring metal silicide layers formed on the polysilicon gate structure, and on the source/drain region located in the silicon capping and silicon-germanium-carbon layers, is next addressed and schematically described using FIGS. 5–6. Source/drain extension region 7, is first formed in portions of silicon capping layer 3b, of silicon-germanium-carbon layer 2, and in a top portion of semiconductor substrate 1, not covered by polysilicon gate structure 6. This is accomplished via implantation of arsenic or phosphorous ions, at an energy less than 10 KeV, at a dose between about 1E15 to 1E16 atoms/cm$^2$. Next an insulator layer such as silicon oxide or silicon nitride is deposited at a thickness between about 500 to 2000 Angstroms, via LPCVD or PECVD procedures. A selective, anisotropic RIE procedure, using $CHF_3$ or $CF_4$ as an etchant, is then employed to define insulator spacers 8, located on the sides of polysilicon gate structure 6. Heavily doped source/drain region 9, is next formed in portions regions of silicon capping layer 3b, silicon-germanium-carbon layer 2, and in a top portion semiconductor substrate 1, not covered by polysilicon gate structure 6, or by insulator spacers 8. This is accomplished via implantation of arsenic or phosphorous ions, at an energy between about 1 to 50 KeV, at a dose between about 1E15 to 1E16 atoms/cm$^2$. A rapid thermal anneal (RTA) procedure is next performed at conditions needed to activate the implanted ions, however without strain relaxation of the silicon-germanium-carbon layer. This is accomplished at a temperature between about 850 to 1100° C., for a time between about 1 to 60 sec. The result of these procedures is schematically shown in FIG. 5.

Metal silicide regions 10, shown schematically in FIG. 6, are next selectively formed on exposed portions of polysilicon and silicon. A metal layer such as titanium, tantalum, tungsten, nickel, or cobalt, is first deposited via plasma vapor deposition (PVD) procedures, at a thickness between about 20 to 200 Angstroms. RTA procedures are next employed at a temperature between about 400 to 700° C., for a time between about 5 to 60 sec, to form metal silicide regions 10, on polysilicon gate structure 6, and on heavily doped source/drain region 9. Portions of unreacted metal, located on insulator spacers 8, and on STI regions 4, are selectively removed via wet etch procedures, using a solution comprised of $H_2O_2$—HCl—$NH_4OH$—$H_2SO_4$. Metal silicide regions 10, comprised of either titanium silicide, tantalum silicide, tungsten silicide, nickel silicide, or cobalt silicide, are formed on the portions of heavily doped source/drain region 9, located in silicon capping layer 3b, and in silicon-germanium-carbon layer 3.

Figure 7:
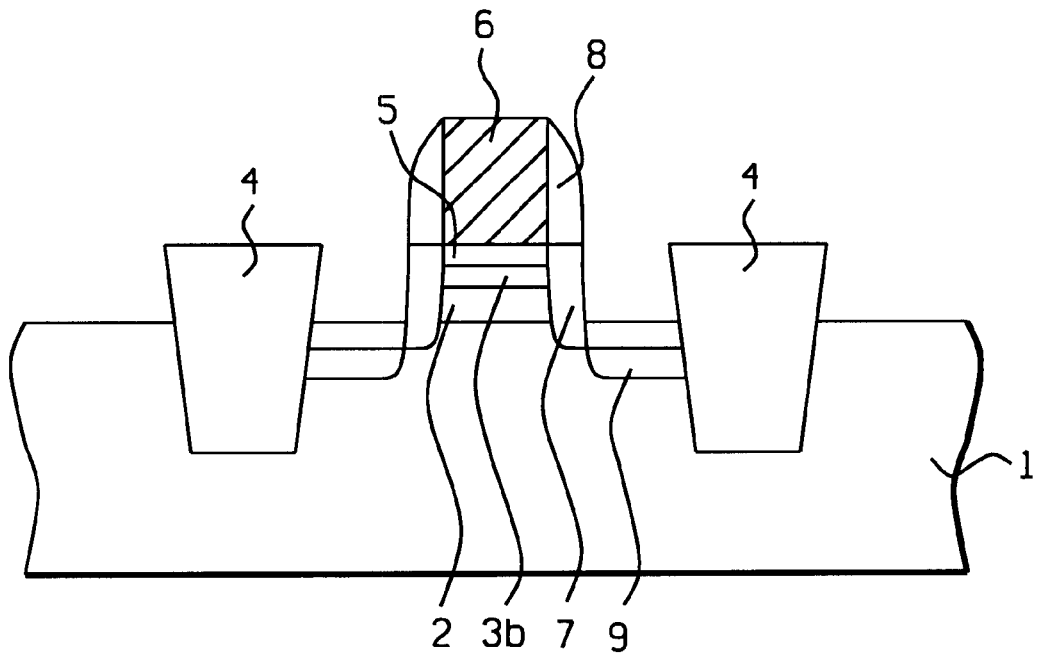
Figure 8:
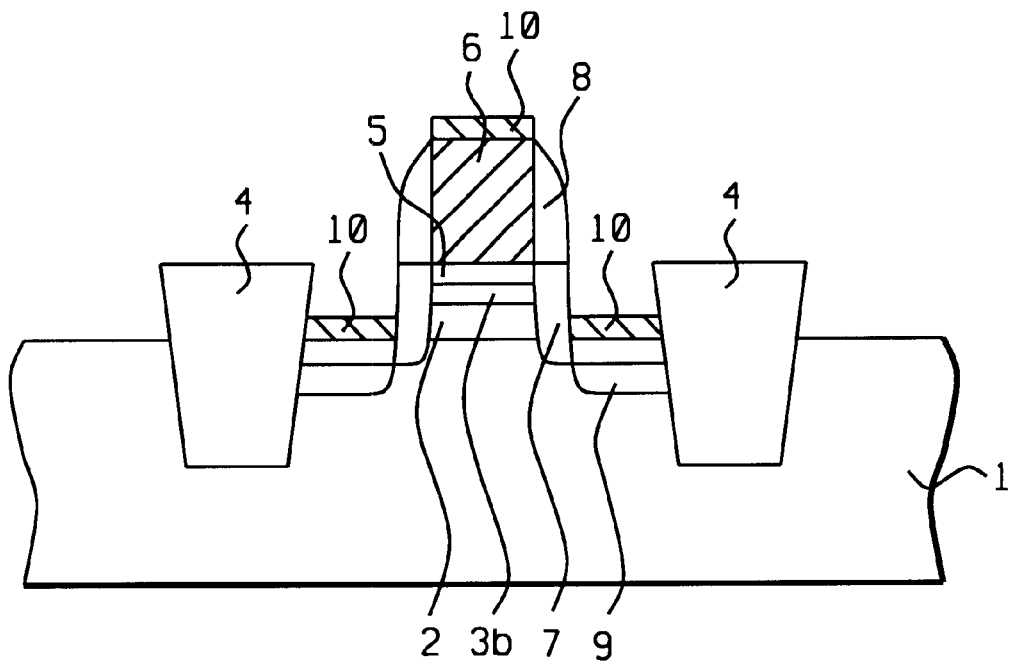

A second option is the formation of metal silicide regions on portions of heavily doped source/drain region 9, located only in semiconductor substrate 1. This is accomplished via selective removal of exposed portions of silicon capping layer 3b, and of silicon-germanium carbon layer 2, performed after insulator spacer formation, prior to metal silicide formation. The selective removal procedure, performed either prior to, or after heavily doped source/drain formation, is accomplished via dry etching procedures using $Cl_2$ or $SF_6$ as an etchant for exposed silicon. This is schematically shown in FIG. 7. Metal silicide formation, performed using identical procedures and metal layers, as previously described in the prior option, now results in metal silicide regions 10, located on portions of heavily doped source/drain region 9, located only in semiconductor substrate 1, not on heavily doped regions located in the tensile strained, silicon-germanium-carbon layer, as was the case in the previous option. The result of this option is schematically shown in FIG. 8.

Figure 9:
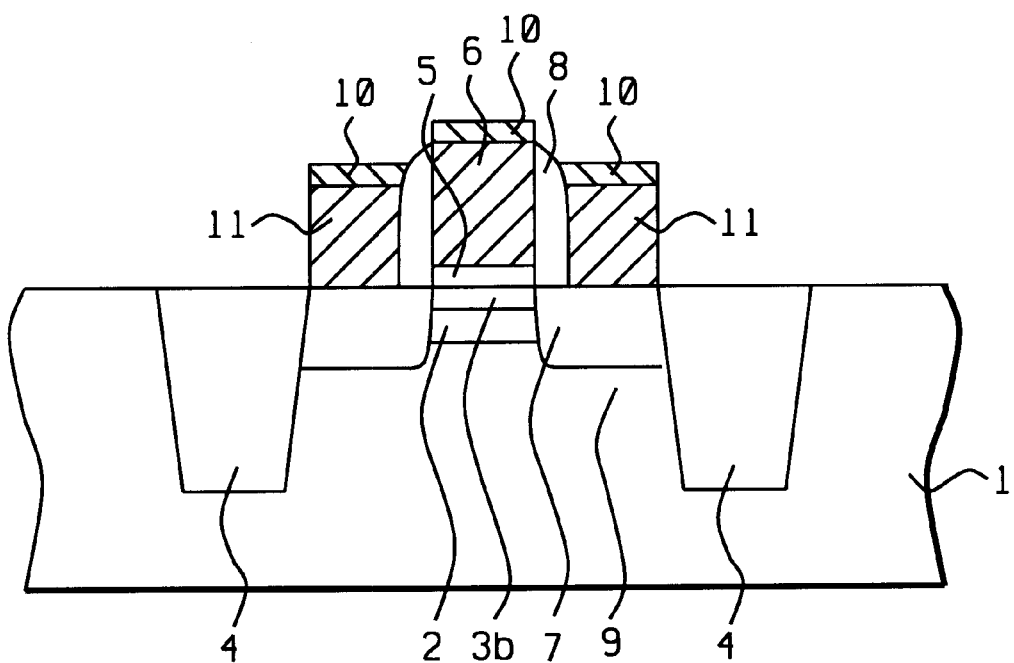

A third option used to avoid formation of the heavily doped source/drain region in the tensile strained silicon-germanium-carbon layer, and to prevent consumption of this layer during the metal silicide formation procedure, is the use of raised source/drain structure, described schematically in FIG. 9. After formation of source/drain extension region 7, in silicon capping layer 3b, in silicon-germanium-carbon layer 2, and in a top portion of semiconductor substrate 1, and after formation of insulator spacers 8, on the sides of polysilicon gate structure 6, a procedure used to selectively grow silicon on exposed portions of source/drain extension region 7, is performed. The selective epitaxial growth procedure is performed at a temperature between about 400 to 800° C., using silane, or disilane and hydrogen chloride as a source, resulting in the growth of raised source/drain structures 11, propagating upwards from exposed portions of source/drain extension region 7. Raised source/drain structures 11, can be doped in situ during growth with the addition of arsine, or phosphine to a silane or disilane ambient, or raised source/drain structures 11, can be grown intrinsically than doped via implantation of arsenic or phosphorous ions. Formation of metal silicide regions 10, again performed using identical procedures and metal layers as previously described in the prior options, now results in metal silicide regions 10, located on top surface portions of raised source/drain region 11, not on heavily doped regions located in the tensile strained, silicon-germanium-carbon layer, thus avoiding possible involvement of germanium and carbon ions in the tensile strained silicon-germanium-carbon channel layer, during the metal silicide formation procedure. The result of this option is schematically shown in FIG. 9.

Finally passivation, contact hole etch, metal deposition and metal patterning procedures are performed to complete the fabrication of the MOSFET device, featuring enhanced carrier transport properties via the use of a channel region comprised of a silicon-germanium-carbon layer, under biaxial tensile strain. Although this invention was described for an N channel, MOSFET device, it is understood that the identical procedure for forming a silicon-germanium-carbon channel layer, under biaxial tensile or compressive strain, can be applied to P channel MOSFET devices.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a semiconductor device incorporated with a strained channel, on a semiconductor substrate, comprising the steps of:

forming a semiconductor alloy layer on said semiconductor substrate, wherein said semiconductor alloy layer is comprised with a first element, a second element, and a third element;

forming a gate insulator layer overlying said semiconductor alloy layer;

forming a gate structure on said gate insulator layer forming insulator spacers on sides of said gate structure;

forming source/drain regions in area of said semiconductor alloy layer and in an area of said semiconductor substrate not covered by said gate structure or by said insulator spacers;

removing portions of said semiconductor alloy not covered by said gate structure or by said insulator spacers, exposing underlying portions of said semiconductor substrate comprised with said source/drain region; and forming metal silicide regions on said portions of said semiconductor substrate comprised with said source/drain region.

2. The method of claim 1, wherein said semiconductor alloy layer is a semiconductor alloy comprising of silicon, germanium, and carbon.

3. The method of claim 1, wherein said semiconductor alloy is formed by epitaxial growth procedures.

4. The method of claim 1, wherein said semiconductor alloy layer is obtained by an epitaxial growth of a second semiconductor alloy comprising of silicon and germanium, and implantation of carbon atoms into said second semiconductor alloy.

5. The method of claim 4, wherein said semiconductor alloy layer has a natural lattice constant that is larger than that of said semiconductor substrate, so that said semiconductor alloy layer is under compressive strain.

6. The method of claim 4, wherein said semiconductor alloy layer has a natural lattice constant that is smaller than that of said semiconductor substrate, so that said semiconductor alloy layer is under tensile strain.

7. The method of claim 1, wherein said semiconductor alloy layer is silicon-germanium-carbon layer, denoted as $Si_{(1-x-y)}Ge_xC_y$, wherein x is between 0 to 0.8 and y is between about 0 to 0.04.

8. The method of claim 1, wherein the thickness of said semiconductor alloy layer is between about 20 to 500 Angstroms.

9. The method of claim 1, wherein said gate insulator layer is a silicon dioxide gate insulator layer.

10. The method of claim 1, wherein said gate insulator layer is thermally grown to a thickness between about 5 to 100 Angstroms.

11. A method of fabricating a semiconductor device incorporated with a strained channel, on a semiconductor substrate, comprising the steps of:

forming a semiconductor alloy layer on said semiconductor substrate, wherein said semiconductor alloy layer is comprised with a first element, a second element, and a third element;

forming a semiconductor capping layer on said semiconductor alloy layer;

forming a gate insulator layer overlying said semiconductor alloy layer;

forming a gate structure on said gate insulator layer, with said gate structure comprised of a conductive layer and of underlying silicon capping layer;

forming insulator spacers on sides of said gate structure;

forming source/drain regions in portions of said silicon capping layer, portions of said semiconductor substrate, and in portions of said semiconductor alloy layer not covered by said gate structure of by said insulator spacers;

selectively removing portions of said silicon capping layer, and portions of said semiconductor alloy layer not covered by said gate structure or by said insulator spacers, exposing underlying portions of said semiconductor substrate comprised with said source/drain regions; and forming metal silicide regions on portions of said semiconductor substrate comprised with said source/drain regions.

12. The method of claim 11, wherein said semiconductor alloy layer is a semiconductor alloy comprising silicon, germanium, and carbon, obtained by epitaxial growth procedures.

13. The method of claim 11, wherein said semiconductor alloy layer is a semiconductor alloy comprising silicon, germanium, and carbon, obtained by epitaxial growth of a second semiconductor alloy comprising of silicon and germanium, and an implantation of carbon atoms into said second semiconductor alloy.

14. The method of claim 11, wherein said semiconductor alloy layer is silicon-germanium-carbon, denoted as $Si_{(1-x-y)}Ge_xC_y$, wherein x is between about 0 to 0.8, and y is between about 0 to 0.04.

15. The method of claim 14, wherein said semiconductor alloy layer has a natural lattice constant that is larger than that of said semiconductor substrate, so that said semiconductor alloy layer is under compressive strain.

16. The method of claim 14, wherein said semiconductor alloy layer has a natural lattice constant that is smaller than that of said semiconductor substrate, so that said semiconductor alloy layer is under tensile strain.

17. The method of claim 11, wherein the thickness of said semiconductor alloy layer is between about 20 to 500 Angstroms.

18. The method of claim 11, wherein said gate insulator layer is a silicon dioxide gate insulator layer.

19. The method of claim 11, wherein said gate insulator layer is thermally grown to a thickness between about 5 to 100 Angstroms.

20. The method of claim 11, wherein said semiconductor capping layer is comprised of silicon.

21. The method of claim 11, wherein said semiconductor capping layer has a final thickness between about 10 to 100 Angstroms.

22. A method of fabricating a semiconductor device on a semiconductor substrate, featuring a strained channel layer, comprising the steps of:

forming isolation regions in a top portion of said semiconductor substrate;

performing a first epitaxial growth procedure to selectively grow a strained channel layer on substantially the portions of said semiconductor substrate not occupied by said isolation regions;

performing a second epitaxial growth procedure to selectively grow a capping layer on said channel layer;

forming a gate insulator layer overlying said capping layer;

forming a gate structure on said gate insulator layer, with said gate structure comprised of a conductive layer and of underlying silicon capping layer;

forming insulator spacers on sides of said gate structure;

forming source/drain regions in portions of said silicon capping layer, portions of said semiconductor substrate, and in portions of said semiconductor alloy layer, not covered by said gate structure or by said insulator spacers;

selectively removing portions of said silicon capping layer, and portions of said semiconductor alloy layer not covered by said gate structure or by said insulator spacers, exposing underlying portions of said semiconductor substrate comprised with said source/drain regions; and forming metal silicide regions on portions of said semiconductor substrate comprised with said source/drain regions.

23. The method of claim 22, wherein said strained channel layer is a semiconductor alloy layer comprising silicon, germanium, and carbon obtained by epitaxial growth procedures.

24. The method of claim 22, wherein said strained channel layer is a semiconductor alloy layer comprising silicon, germanium, and carbon, obtained by epitaxial growth of a second semiconductor alloy comprising silicon and germanium, and an implantation of carbon atoms into said second semiconductor alloy.

25. The method of claim 22, wherein said semiconductor alloy layer is silicon-germanium-carbon, denoted as $Si_{(1-x-y)}Ge_xC_y$, wherein x is between about 0 to 0.8, and y is between about 0 to 0.04.

26. The method of claim 25, wherein said semiconductor alloy layer has a natural lattice constant that is larger than that of said semiconductor substrate, so that said semiconductor alloy layer is under compressive strain.

27. The method of claim 25, wherein said semiconductor alloy layer has a natural lattice constant that is smaller than that of said semiconductor substrate, so that said semiconductor alloy layer is under tensile strain.

28. The method of claim 22, wherein the thickness of said semiconductor alloy layer is between about 20 to 500 Angstroms.

29. The method of claim 22, wherein said gate insulator layer is a silicon dioxide gate insulator layer.

30. The method of claim 22, wherein said gate insulator layer is thermally grown to a thickness between about 5 to 100 Angstroms.

31. The method of claim 22, wherein said semiconductor capping layer is comprised of silicon.

32. The method of claim 22, wherein said semiconductor capping layer has a final thickness between about 10 to 100 Angstroms.

* * * * *